United States Patent [19]
Hurley

[11] Patent Number: 4,630,218
[45] Date of Patent: Dec. 16, 1986

[54] CURRENT MEASURING APPARATUS

[75] Inventor: James R. Hurley, Brookfield, Wis.

[73] Assignee: Cooper Industries, Inc., Houston, Tex.

[21] Appl. No.: 774,397

[22] Filed: Sep. 10, 1985

Related U.S. Application Data

[63] Continuation of Ser. No. 487,801, Apr. 22, 1983, abandoned.

[51] Int. Cl.$^4$ .................. G01R 19/00; G01R 19/65; G01R 19/30
[52] U.S. Cl. .................................. 364/481; 364/483; 324/76 R
[58] Field of Search ............. 364/483, 486; 324/76 R, 324/96, 141, 142, 135, 118; 328/28, 30–32, 160; 340/347 AD; 363/31, 41, 126; 455/608, 612, 613

[56] References Cited

U.S. PATENT DOCUMENTS

| | | | |
|---|---|---|---|
| 3,062,442 | 11/1962 | Boensal et al. | 364/486 |
| 3,727,123 | 4/1973 | Smith | 322/99 |
| 3,764,908 | 10/1973 | Elms | 324/142 |
| 3,953,795 | 4/1976 | Brunner et al. | 324/142 |
| 3,955,138 | 5/1976 | Milkovic | 324/142 |
| 4,025,803 | 5/1977 | Norberg | 328/31 |
| 4,282,576 | 8/1981 | Elms et al. | 364/483 |
| 4,356,395 | 10/1982 | Miller | 340/347 AD |
| 4,399,510 | 8/1983 | Hicks | 364/464 |
| 4,463,311 | 7/1984 | Kobayshi | 364/483 |
| 4,561,117 | 12/1985 | Kuhn | 455/608 |

OTHER PUBLICATIONS

"A Users Handbook of D/A and A/D Converters" by E. R. Hnatek, Jun. 1976, pp. 246–249.
"Practical Digital Design Using IC's", J. D. Greenfield, 1977, pp. 498–499.

Primary Examiner—Errol A. Krass
Assistant Examiner—Danielle Laibowitz
Attorney, Agent, or Firm—Nelson A. Blish; Eddie E. Scott; Alan R. Thiele

[57] ABSTRACT

A current measuring apparatus utilizes a known fundamental frequency, e.g., 60 Hz, for measuring current and includes a sensing and measurement pulse generation circuit including a current transformer for developing a low power signal directly related to the line current in a powerline, and a diode bridge with a first Zener diode for sensing when the developed current related signal exceeds a first predetermined positive threshold value and a second Zener diode for sensing when the developed current related signal falls below a second predetermined negative threshold value. Across the bridge is an LED for generating a first measurement signal having a duration related to the time when the developed signal exceeds the positive threshold value and second measurement signal during the time when the current related signal falls below the negative threshold value. The apparatus further includes processing circuitry and optical fibers for transmitting the measurement signals to the processing circuitry which is capable of processing the measurement signals durations ($t_1$ or $t_2$) to determine parameters of the developed current related signal thereby to determine the current flowing in the power line.

21 Claims, 6 Drawing Figures

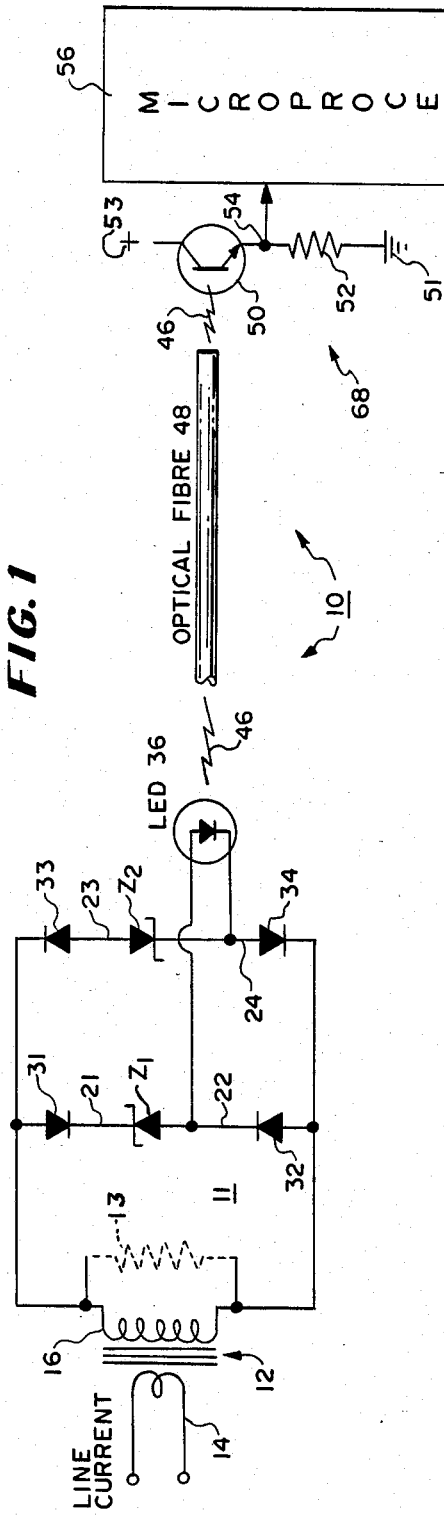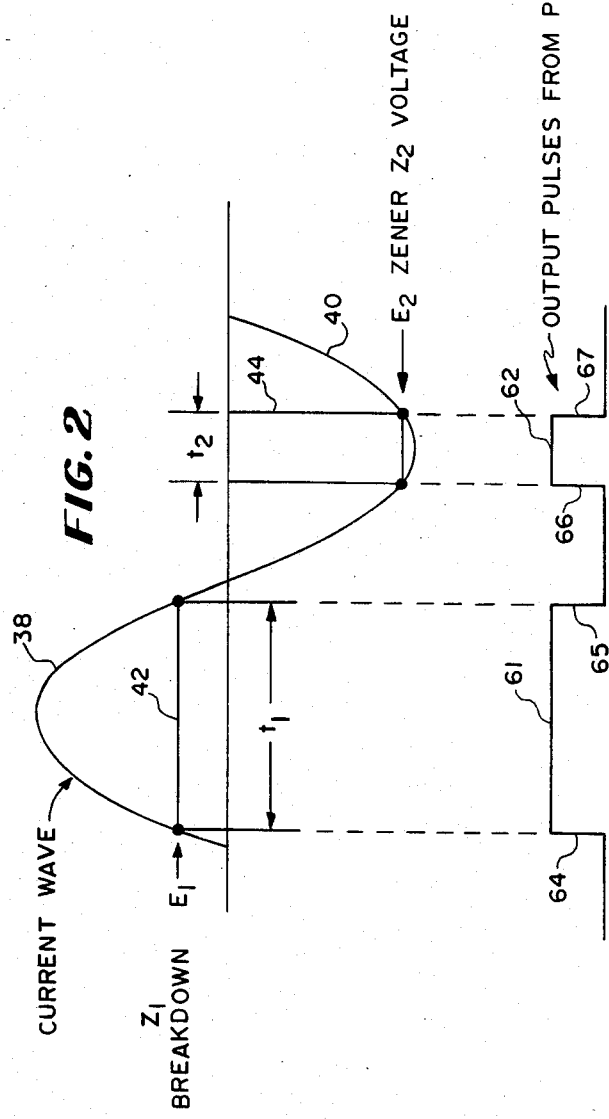

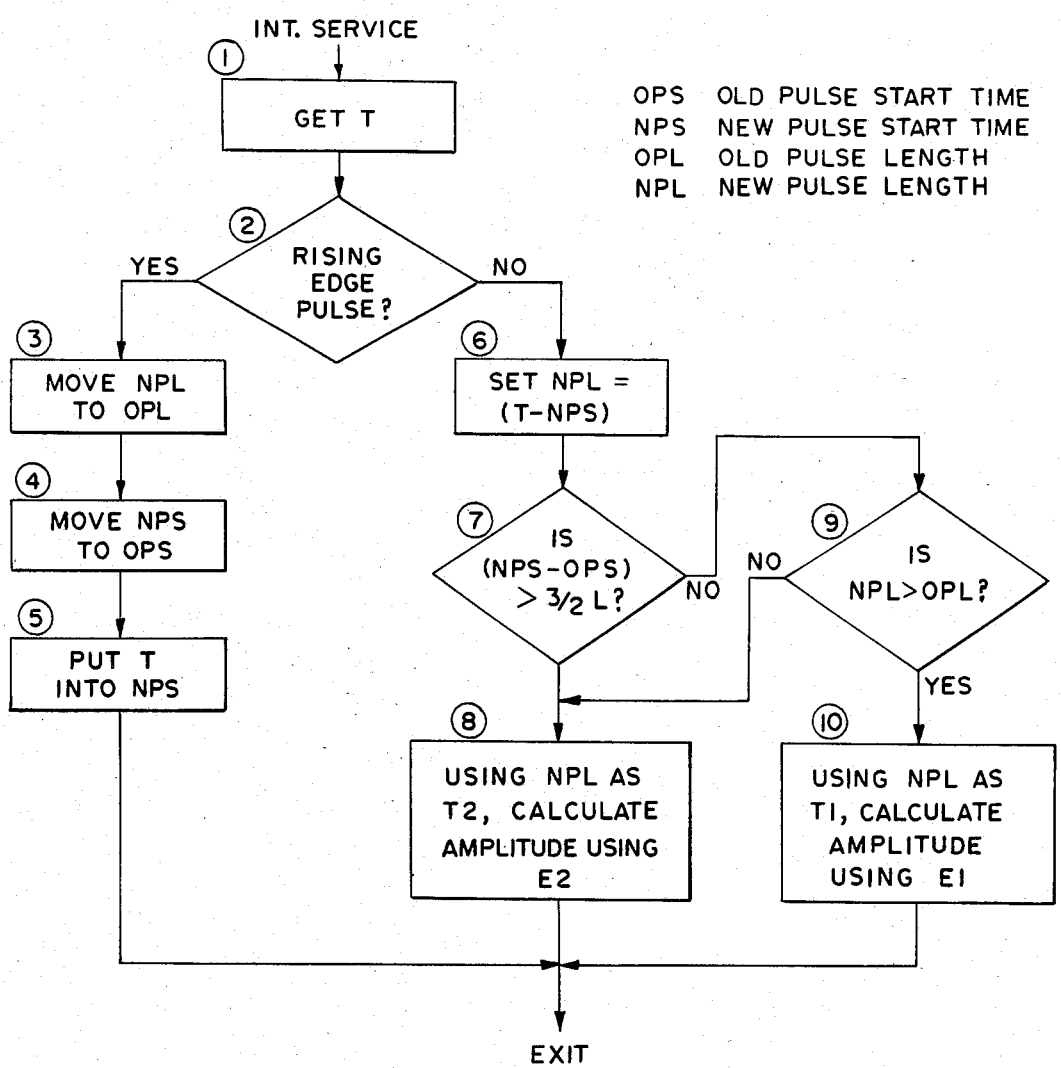

CURRENT MEASURING APPARATUS

This application is a continuation of application Ser. No. 487,801, filed Apr. 22, 1983 now abandoned.

BACKGROUND OF THE INVENTION

The present invention relates to a simple apparatus for measuring current, such as power line current, utilizing current waveform sensing circuitry and processing circuitry including a microprocessor for computing current from current waveform measurements.

Heretofore various circuits for measuring current have been proposed and examples of some of the prior circuit proposals are disclosed in the following patents:

| U.S. PAT. NO. | PATENTEE |
|---|---|
| 3,467,858 | Burnett |
| 4,054,834 | Boirat et al |
| 4,117,399 | Ono et al |
| 4,126,825 | Houston et al |
| 4,182,983 | Heinrich et al |
| 4,206,405 | Pentecost |
| 4,209,743 | Muller et al |
| 4,291,377 | Schneider et al |

Also see the Wegner East German Pat. No. 139,914, and the Hahn West German Published Patent Application No. 23 33 907.

The Burnett U.S. Pat. No. 3,467,858 discloses circuitry including a current transformer coupled to a power line for developing a current related signal, circuitry for converting the signal to a relative high frequency pulse train much higher than the line frequency, transmitting the pulse train optically to processing circuitry where the pulse train is converted back to an electrical signal and processed utilizing rectifiers, pulse generators, amplifiers, wave shapers, counters, timers and comparators.

The Boirat U.S. Pat. No. 4,054,834 discloses an alternating current measuring device comprising an isolation transformer and bridge circuit with two light emitting diodes for developing analog light signals which are transmitted by optic fibers to two light receptors which convert half wave pulses to electrical signals which are applied to a differential amplifier. Here the instantaneous magnitude of the measured current is converted to a proportional instantaneous magnitude of light. At the receptors, the luminous intensity is measured and determines the instantaneous value of the current.

It will be appreciated that the accuracy of the Boirat device is affected by optical attenuation in the optical fibers by mismatching of the fiber terminations and splices and by electrical/optical and optical/electrical conversion gains.

The Ono U.S. Pat. No. 4,117,399 discloses a light converter including an optical effect element for use in an apparatus for measuring alternating current which counts peaks.

The Houston et al. U.S. Pat. No. 4,126,825 discloses an electronic current transducer utilizing fiber optics isolation and light signal transmission and includes a fast analog channel and a slow digital channel and a comparator which compares the slower digital signal with a light signal converted from the fast analog signal. The line current information is transmitted as a pulse train developed by a voltage to frequency converter.

The Heinrich et al. U.S. Pat. No. 4,182,983 discloses an A.C. electric energy measuring circuit which converts a di/dt analog input signal into a pulse width modulated signal responsive to the amplitude of a current component of an alternating current energy quantity to be measured.

U.S. Pat. No. 4,206,405 is directed to a watt-hour meter that permits time modulation of the power utilized whereby varying rates can be imposed upon the power user.

U.S. Pat. No. 4,209,743 discloses a circuit arrangement for measuring current at high potential utilizing a capacitor which is charged in accordance with the current to be measured. The capacitor is connected across a light emitting diode so that light pulses are generated having a frequency proportional to the current. A Zener diode and a light emitting diode (LED) are utilized in this circuit arrangement.

A similar circuit arrangement utilizing a Zener diode and LED in a voltage measuring converter is also disclosed in East German Pat. No. 139,914.

U.S. Pat. No. 4,291,377 discloses an apparatus for measuring AC power which subtracts an average value of current and voltage from sampled instantaneous current and voltage values respectively. The resultant current and voltage values are multiplied so as to obtain a power measurement substantially free of any sampling errors and any DC levels.

The West German Offenlegungsschrift Pat. No. 23 33 907 discloses a DC current measurement circuit arrangement that converts the current to a proportional pulse width or frequency modulated pulse train. The pulse train is converted to optical pulses which are transmitted optically and then converted back to electrical pulses and integrated.

As will be described in greater detail hereinafter, the current measuring apparatus of the present invention differs from all the various circuit arrangements disclosed in the prior art patents referred to above by providing for the development or generation of measurement pulses in the sensing circuitry of the apparatus which pulses are exactly at the line frequency or twice the line frequency.

In the apparatus of the present invention, it is the duration of each individual measurement pulse which is used to determine the current magnitude and such measurement pulse width measurements are highly accurate due to the high accuracy of a crystal controlled oscillator of a microprocessor control circuit forming the measurement pulse processing circuitry of the current measuring apparatus.

Also in one preferred embodiment, a low threshold Zener diode is used for generating a measurement pulse having a long duration at the low threshold during one half cycle of the current waveform and a high threshold Zener diode is used for generating a measurement pulse having a short duration at the high threshold during the other half cycle of the current waveform.

BRIEF DESCRIPTION OF DRAWINGS

FIG. 1 is a schematic circuit diagram of the current measuring apparatus of the present invention;

FIG. 2 is a graph of the current waveform developed in the sensing circuitry of the current measuring apparatus in FIG. 1, and a graph of the output pulses generated in and transmitted from the sensing circuitry to the processing circuitry of the current measuring apparatus, shown in FIG. 1;

FIG. 5 is a current equation for computing current from the information received by the microprocessor shown in FIG. 1; and FIG. 6 is a flowchart of the protocol, routine or procedure that the microprocessor will follow in processing data from processing circuitry, shown in FIGS. 1, 3 and 4.

DETAILED DESCRIPTION OF THE PREFERRED EMBODIMENT

Figure 3:
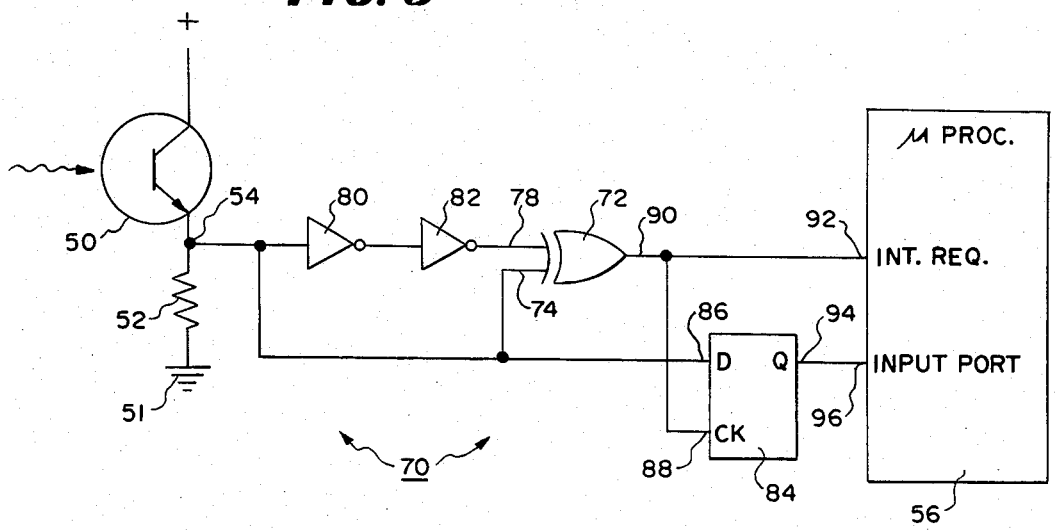
FIG. 3 is a schematic circuit diagram of another embodiment of the processing circuitry which can be utilized in the current measuring apparatus, shown in FIG. 1.

Referring now to FIG. 1, there is illustrated therein a current measuring apparatus 10 constructed according to the teachings of the present invention. Current measuring apparatus 10 includes a current sensing and measurement pulse transmitting circuit 11 comprising a linear coupler or current transformer 12 having as its primary winding 14 one or more turns on a power line from a single or three phase system and a multiturn secondary winding 16 across which a current waveform signal is developed. In the case where a current transformer 12 is utilized in circuit 11 a resistor 13 is required across its secondary winding load side 16 to provide thereacross a voltage directly proportional to the measured line current of the power line. This power line may be a high voltage transmission line.

The current sensing unit 11 also includes a diode bridge having four legs 21, 22, 23 and 24, with diodes 31, 32, 33 and 34 located in each leg 21-24 connected with the polarities, shown in FIG. 1. A first Zener diode $Z_1$ with a relatively low threshold breakdown voltage value $E_1$ is situated in the first leg 21 and a second Zener diode $Z_2$ having a relatively high threshold breakdown voltage value $E_2$ is situated in the third leg 23, as shown. A light emitting diode (LED) 36 is connected across the bridge and will emit pulses of light on the positive half cycle 38 of the current waveform developed across the secondary winding 16, when the positive half cycle 38 exceeds $E_1$, as seen in FIG. 2. Then another pulse of light is emitted on the negative half cycle 40 of the current wave form if and when the negative half cycle falls below $E_2$. The light pulses may have the same amplitude or different amplitudes and are generally indentified by reference numeral 46 in FIG. 1.

Electrical pulses 42 and 44 are generated on the half cycles 38 and 40, as shown in FIG. 2, and can be considered as first and second current measuring pulses having different durations, but also having different amplitude values.

The light pulses 46 from the light emitting diode 36 generated by electrical pulses 42 and 44 are transmitted via an optical fiber or fiberoptic system 48 to a phototransistor 50, which, when it receives the light generated by either pulse 42 or 44 is completely on.

This phototransistor 50 is connected between a positive potential 53 and ground or neutral 51 through a resistor 52 which establishes a voltage signal at the emiter 54 thereof which is supplied as an input to microprocessor 56, as shown.

The output signal at emitter 54 from the phototransistor 50 is shown in FIG. 2, and includes a first measurement signal 61 and a second measurement signal 62 each having different durations as a result of the different voltage levels of Zener diodes $Z_1$ and $Z_2$.

The signal 61 has a longer duration due to the lower breakdown voltage $E_1$ of Zener diode $Z_1$, and has a rising edge 64 and a falling edge 65. The second measurement signal 62 has a shorter duration due to the highter breakdown voltage $E_2$ of Zener diode $Z_2$, and has a rising edge 66 and a falling edge 67. Both signals, however, have the same amplitude, as shown.

It will be appreciated that with a known fundamental frequency of current being measured, namely 60 Hz, all the information necessary to measure the current signal is contained in the light pulses 46 which are emitted by LED 36 and transmitted through optical fiber 48 to the phototransistor 50. More specifically, the position and duration of the pulses should occur at a frequency rate of 120 Hz, for a current waveform that exceeds, on its respective half cycles, both threshold voltages established by the Zener diodes $Z_1$ and $Z_2$.

An understanding of how this is achieved is best understood with reference to FIG. 2. Here the current waveform is shown causing a first measurement pulse 42 which generates at the output 54 of phototransistor 50, a first measurement signal 61 having a duration or length $t_1$ during the positive half cycle 38 of the current waveform and a shorter measurement signal or pulse 62 at the output 54 of phototransistor 50 having a duration or length $t_2$ during the negative half cycle 40 of the current waveform. The duration of these current pulses or signals 61 and 62 must be determined by the microporcessor 56 in order to measure the current magnitude for the current flowing in the subject power line.

If the current waveform amplitude decreases slightly, the negative going part of the cycle 40 will not reach the threshold voltage level $E_2$ of the second Zener diode $Z_2$, and no measurement pulses 62 will be developed or generated during each negative half cycle 40. In other words, $t_2$ will become 0, and the pulses 62 will not exist, and there will be no pulse duration $t_2$. Only the pulses 61 will be generated having a duration $t_1$.

As the amplitude of the current wave form diminishes further, the duration $t_1$ of the pulse 61 will shrink. Finally, at a current amplitude equal to the threshold voltage level $E_1$ of the Zener diode $Z_1$, pulses 61 will cease and $t_1$ will go to 0.

In order to obtain and utilize the values of the durations $t_1$ and $t_2$ of pulses 61 and 62, microprocessor 56 must measure when each pulse 61 or 62 starts and when each pulse 61 and 62 finishes.

For this purpose, the microprocessor 56 must be able to differentiate between the rising edges 64 and 67 of the pulses 61 and 62. Furthermore, in applying a current computation algorithm, the microprocessor 56 must be able to differentiate between long pulses 61 and short pulses 62, and in particular, it must be able to determine when shorter pulses 62 are non-existent. This is not a difficult matter, since the basic frequency of the waveform being measured is known, namely it is 60 Hz. Therefore, if the measurement pulses 61 and 62 occur at 120 Hz (twice the line frequency), the microprocessor 56 logic circuitry knows that there will be alternate pulses due to the positive and negative half cycles 38 and 40 of the current wave or waveform.

On the other hand, if the pulse repetition rate is exactly at the AC frequency (60 Hz), then the microprocessor 56 knows that the magnitude of the measured waveform exceeds the threshold value $E_1$ of the Zener diode $Z_1$, but is less than the threshold $E_2$ of the Zener diode $Z_2$.

The manner in which microprocessor 56 processes the data it receives via the pulses 61 and 62 can be accomplished in various ways. For example, one arrangement would require microprocessor 56 to do as much of the work as possible via software, so that a minimum of equipment is required. All that is necessary is to employ circuitry which signals the interrupt request processor at each rising and at each falling edge, as it is received from the phototransistor 50. The nature of the edge, such as edges 64, 65, 66 and 67 either rising or falling, is then stored in a latch and made accessible to one of the microprocessor input lines.

During the interrupt sequence, the status of the latch is interrogated by the microprocessor 56 so that microprocessor 56 can determine whether this is the start or the end of a measurement pulse, e.g., rising edge 64 or falling edge 65 of pulse 61, which has signalled the microprocessor 56.

When the microprocessor 56 acknowledges the interrupt request, it immediately reads its own internal real time clock to fix the time where the edge of the measurement pulse lies. Error can be introduced into the computation at this point for the reason that when the interrupt request signal arrives, the microprocessor 56 may be in the midst of execution of another instruction. The interrupt request then cannot be acknowledged and the interrupt processing routine entered into by the microprocessor 56, until the previous interrupt and routine requested thereby is completed.

This error is a time lag and can range from none if microprocessor 56 had just completed another instruction as the interrupt request signal arrives, or it can be as long as the time required to execute the slowest instruction. The latter would occur when the interrupt request signal arrives immediately after the slowest instruction has started. Depending on the particular microprocessor 56 used, this variable of an unknown length of time may range from 2 to, perhaps, 10 microseconds.

There is also another time lag that occurs between the initial request for interrupt and the actual reading of the time duration information contained in the measurement pulses 61 and 62 by the microprocessor 56. However, this time lag is fixed by the instruction sequence in the interrupt service routine of microprocessor 56 and will be the same for all time duration measurements. Since the ultimate use of the time measurement is to compute intervals by means of a subtraction process, the constant offset or lag is cancelled from the result and no net error is introduced into the calculation.

Another system which relieves some of the burden on microprocessor 56 is the use of a counter in the processing circuitry which is clocked at the rising edges 64 and 66 of the pulses 61 and 62, respectively.

Between pulses 46 from LED 36, the counter would be in a reset state. On receiving the rising edge 64 or 66 of a pulse 61 or 62, the input of the counter would be enabled and the counter allowed to count out at the clock rate.

Then, on receipt of the falling edges 65 or 67 of the pulses, the counting process would be terminated and the value of the pulse duration would then be held in the counter. At this point, microprocessor 56 would be signalled with an interrupt request. When microprocessor 56 is finished executing its current instruction, it would read the value of the time interval stored in the coutner and then reset the counter to prepare it for the rising edge of the next measurement pulse 62 or 61.

Phototransistor 50, resistor 52 and microprocessor 56 comprise current measurement signal receiving and processing circuitry 68 where the microprocessor 56 software does all the work to process the incoming information. Other processing circuitry can be utilized, as shown in FIGS. 3 and 4, and as described below.

Figure 4:
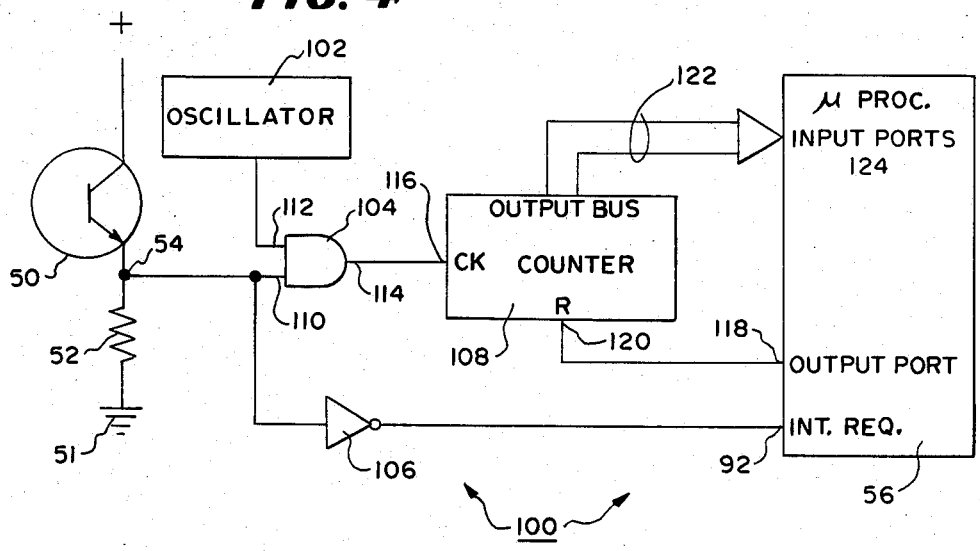
FIG. 4 is a schematic circuit diagram of still another embodiment of the processing circuitry which can be utilized in the current measuring aparatus, shown in FIG. 1.

Referring now to FIG. 3, there is illustrated therein processing circuitry 70 including phototransistor 50, resistor 52 and microprocessor 56. Processing circuitry 70 includes an exclusive OR gate 72 which has one input 74 connected directly to output 54 of phototransistor 50 and another input 78 which receives a time delayed output signal from the output 54 of phototransistor 50. This time delay is achieved by passing the signal at output 54 through first and second, series connected, unity gain, inverting amplifiers 80 and 82.

As shown, processing circuitry 70 also includes a D type latch 84 which has a data input 86 connected directly to the output 54 of phototransistor 50 and a clock input 88 which is coupled to output 90 of the OR gate 72. This output 90 is also connected to the interrupt request input 92 of the microprocessor 56 while the Q output 94 of the latch 84 is connected to an input port 96 of the microprocessor 56.

It will be apparent from FIG. 3, that only four logic elements 72, 82, 80 and 84 are required to process the output signal from phototransistor 50 before it is applied to microprocessor 56. First, the inverters 80 and 82 function to introduce a time delay into the signal at input 78 from the output 54 of phototransistor 50. In this way the input signal or pulse 61 or 62 at input 74 and the delayed measurement signal or pulse 61 or 62 at input 78 are applied to the exclusive OR gate 72 at different times so that elements 72, 80 and 82 form a pulse edge detector. In this respect, at the output 90 of OR gate 72, a positive pulse is outputted when there is a low and high, or high and low, at the inputs 74 and 78 of the exclusive OR gate 72, and such output pulse is supplied to the interrupt request input 92 of the microprocessor 56. The microprocessor interrupt request input 92 is sensitive to a rising edge.

In the meantime, the signal at output 90 of OR gate 72 is also applied to the clock input 88 of latch 84 while the data input to latch 84 at data input 86 is the output measurement signal 61 or 62 from phototransistor 50.

The output signal at the Q output 94 of latch 84 assures a logic state of 1 when a rising edge has been received at data input 86 and has a logic 0 state when a falling edge is received at data input 86.

In other words, when the logic level at input 74 is initially a logic 1, and the logic level at input 78 is initially a logic 0, this will generate a logic 1 at output 90. The output logic level of 1 is sent to the interrupt request input 92 to cause microprocessor 56 to read the output of Q. In the meantime, a logic level 1 is also at data input 86 when the clock signal logic 1 from the output 90 is applied to the clock input 88 causing a logic 1 at the output 94. This logic 1 output will remain at the Q output 94 until there is another clocking signal into latch 84 which occurs when there is still a logic 1 at the input 78 when the input 74 goes to logic 0 at the end of pulse 61 and 62. A logic 1 signal will then again be applied from output 90 to clock input 88. However, the input at data input 86 is now a logic 0 and that input will be clocked to output 94 so that when the interrupt request receives a logic 1 signal, or interrupt signal and finds the logic at the input port to be 0, it knows that it is a falling edge rather than a rising edge. In this way, microprocessor 56 is supplied with information enabling it to distinguish between rising edges 64 and 66 of measurement pulses 61 and 62 and falling edges 65 or 67 of measurement pulses 61 or 62.

In FIG. 4, there is illustrated another embodiment of processing circuitry which can be utilized in current measuring apparatus 10, such processing circuitry being generally identified by the reference numeral 100.

Processing circuitry 100 also utilizes phototransistor 50, resistor 52 and a microprocessor 56, plus four elements, namely an oscillator 102, an AND gate 104, an inverter 106 and a counter 108. As shown, the output at the emitter 54 of phototransistor 50 is supplied to one input 110 of AND gate 104 and at the same time is supplied to inverting amplifier 106 so that an inversion of the logic signal of output 54 is delivered to interrupt request input 92 of the microprocessor 56. The second input 112 of AND gate 104 receives the output from the oscillator 102.

The output 114 of AND gate 104 is connected to the clock input 116 of counter 108. An output port 118 from microprocessor 56 is connected to reset input 120 of the counter 108 and a plurality of output data lines or a bus 122 from counter 108 are coupled to input ports of microprocessor 56 generally indientified by the reference numeral 124.

Processing circuitry 100 is not subject to any time lag errors, as is the case with the processing circuitry 70 described above. In this respect, the output of the oscillator 102 is ANDed with output 54 of the phototransistor 50 by AND gate 104. The resulting output at 114 is supplied to clock input 116 of counter 108.

When no pulse is being received at the interrupt request input 92 of microprocessor 56, counter 108 is reset so that the output to bus 122 is a logic 0. However, when a pulse 61 or 62 from emitter 54 arrives at the input 110 of AND gate 104, the logic level rises to a logic 1 and AND gate 110 enables oscillator 102 pulses to reach the clock input 116 of counter 108. Meanwhile, the logic 1 signal at input 110 of AND gate 104 is inverted by inverting amplifier 106 so that a logic 0 or falling edge is applied to the interrupt request input 92 of the microprocessor 56. Since this is a falling edge, nothing happens. Also counter 108 is reset when a logic 0 is applied to the interrupt request line so that just as the AND gate starts to pass the oscillating signal from oscillator 102 to the clock input 116 of counter 108, the interrupt request input logic state changes from 1 to 0 and causes a resetting of the clock prior to the count so that only a valid count is counted in the counter.

Therefore, while the measurement pulse is being received optically by phototransistor 50, and electrical pulses 61 or 62 are being applied to input 110 of AND gate 104, counter 108 is counting.

When the incoming pulse signal goes from a logic 1 to a logic 0, and the AND gate stops passing the clock signal to clock input 116, the count by counter 108 stops. Meanwhile, inverter amplifier 106 output changes from a logic 0 to a logic 1 with a rising edge pulse being applied to interrupt request input 92 of microprocessor 56 instructing it to read the count in counter 108. Since this count is fixed or latched in the counter, it does not matter that there may be a time lag on the part of microprocessor 56 in servicing this interrupt request because whenever it does, the count is fixed or latched in the counter 108. Thus, it makes no difference that there is a time lag on the part of microprocessor 56 in servicing this interrupt request because whenever it does get around to servicing the interrupt request, it will have the exact count of pulses from oscillator 102 indicating the time duration $t_1$ of the first measurement pulse 61.

After finishing its present instruction, the microprocessor will service the interrupt request and read the contents of counter 108 via the bus 122. Microprocessor 56 will then transmit a signal on the output line thereof connected to reset terminal 120 of counter 108 so that the contents of the counter are reset in anticipation of receipt of the next pulse.

In FIG. 5, there is illustrated a current equation for computing current from the information received by microprocessor 56. As shown, wave amplitude equals E over sin $\theta$. The current wave amplitude is derived from pulse duration $t_1$ or $t_2$ generated by the voltage threshold values $E_1$ or $E_2$ of the Zener diodes $Z_1$ or $Z_2$. Sensitivity and accuracy of measurement are highest when the pulse 61 or 62 durations $t_1$ or $t_2$ are short and both sensitivity and accuracy diminish when measurement pulse 61 or 62 duration $t_1$ or $t_2$ get longer and approach the half period of the current waveform.

Although in principle the threshold voltage levels $E_1$ or $E_2$ of the Zener diodes $Z_1$ or $Z_2$ could be made the same, it is better to have threshold levels of different values. In this respect, the higher threshold voltage value of the Zener diode $Z_2$ is set to an amplitude of the measured current waveform at which accuracy in the computation based on the lower threshold voltage level of the Zener diode $Z_1$ is no longer acceptable. The short pulses associated with the higher threshold voltage level of the Zener diode $Z_2$ are then used to compute the current. In this way, the dynamic range of the current measuring apparatus 10 is greatly extended.

Referring now to FIG. 6, there is illustrated therein a flowchart of the protocol, routine or procedure that the microprocessor 56 will follow in processing data from the processing circuitry 70, shown in FIG. 3. These steps are as follows:

STEP 1. Immediately upon entry of the interrupt service routine, microprocessor 56 obtains the value of real time from its internal clock and stores it in a location T.

STEP 2. The microprocessor 56 then determines whether the interrupt request signal was caused by a rising edge 64 or 66 of a measurement pulse 61 or 62 or the falling edge 65 or 67 of a measurement pulse 61 or 62. This can be accomplished by reading the status of output 94 of latch 84.

STEP 3. If the interrupt request signal was the rising edge of a pulse, the flow chart sequence moves on to step 3 wherein the new pulse length is moved to the location of the old pulse length.

STEP 4. Here microprocessor 56 moves the new pulse start time to the location of the old pulse start time.

STEP 5. Here real time T is put into the new pulse start time and an exit from the routine is made. The micro-processor is then free to perform other tasks until receipt of the next interrupt request.

STEP 6. If the answer was "no" at STEP 2, that the interrupt request signal was not a rising edge, but a failing edge signal, then the new pulse length is set as T minus the new pulse starting time. Here the pulse length is computed by subtraction.

STEP 7. In this step, a determination is made as to whether both Zener voltage threshold levels are active. In other words, are both threshold values of the Zener diodes $Z_1$ and $Z_2$ being exceeded by the current waveform. If measurement pulses occur less frequently than $1\frac{1}{2}$ times per cycle, the protocol goes to STEP 8.

STEP 8. Here the new pulse length is used as length $t_2$ and the amplitude is calculated using the second threshold value $E_2$.

STEP 9. If the pulses had occurred more frequently than $1\frac{1}{2}$ times per cycle at STEP 7, it is assumed that both voltage levels are active and the routine goes to STEP 9 of the logic diagram where a determination is made, as to whether the voltage value $E_1$ or $E_2$ should be used in the amplitude equation, dependent upon whether the new pulse length is greater than the old pulse length. If it is not, then, the routine goes back to STEP 8. If it is, the routine goes on to STEP 10.

STEP 10. If the old pulse length is less than the new pulse length, then the program goes on to this step where using the new pulse length as $t_1$, the amplitude is calculated using the voltage level $E_1$.

It is to be understood, that in this protocol the equations, shown in FIG. 5, may be used by microprocessor 56, or microprocessor 56 may be provided with a table lookup routine to speed up computations.

Also, after completion of STEP 5, STEP 8 or STEP 9, an exit is made by the microprocessor 56 from the interrupt service routines.

It will be appreciated from the foregoing description that the current measuring apparatus of the present invention provides a simple sensing and measurement pulse generation circuit 11 utilizing a current or isolation transformer 12 and a bridge circuit with Zener diodes $Z_1$ and $Z_2$ having different breakdown voltage levels for developing current measurement pulses and providing an extended dynamic operating range of the apparatus 10.

Further, using the LED 36 across the bridge 18, the optical fiber 48 and a fully on or fully off phototransistor 50 as a receiver, isolation is obtained which is particularly useful if the current is flowing in a high voltage power line. Also, hysteresis effects are eliminated by the use of the conversion, transmission and reconversion from electrical to optical to electrical signals.

Furthermore, the processing circuitry 68, using simply a microprocessor 56 with software or with the additional processing circuit elements of the processing circuits 70 and 100 provide a simple and effective means and method for measuring current.

Also, it will be apparent that modifications can be made to the current measuring apparatus 10 of the present invention. Accordingly, the scope of the invention is only to be limited as necessitated by the accompanying claims.

I claim:

1. A method for measuring alternating current in a power line having a known fundamental frequency including the steps of:
   developing a low power signal directly related to the line current in said power line;
   sensing when said low power signal exceeds a first predetermined positive threshold value;
   sensing when said low power signal falls below a second predetermined negative threshold value;
   generating a first measurement signal comprised of pulses having a duration related to the time when said low power signal exceeds said positive threshold value;
   generating a second measurement signal comprised of pulses having a duration related to the time when said low power signal falls below said negative threshold value;
   transmitting said measurement signals to processing circuitry; and,
   processing said measurement signals to determine parameters of said low power signal thereby to determine the current flowing in said power line.

2. The method of claim 1, wherein said low power signal is developed by means of a current transformer utilizing said power line as the primary winding and having a multi-turn secondary.

3. The method of claim 1, wherein said measurement signals are converted from electrical signals to optical signals and transmitted optically to a photosensitive device for conversion back to electrical signals.

4. The method of claim 1, wherein one of said predetermined threshold values is a relatively low value and the other threshold value is a higher value thereby to provide a greater dynamic range of current measurement.

5. The method of claim 4, wherein said first predetermined positive threshold value is the lower value and said second predetermined negative threshold value is the higher value.

6. The method of claim 1, wherein said measurement signals are fed to a microprocessor.

7. The method of claim 6, including the steps of sensing the rising edge of each of said measurement signals and the falling edge of each of said measurement signals and supplying such information to said microprocessor for processing of said measurement signals.

8. The method of claim 6, including the steps of summing each of said measurement signals with a clocking signal having a predetermined number of pulses per second, supplying said clocking signal for the duration of each of said measurement signals to a counter, counting the pulses received for the duration of each of said measurement signals, temporarily storing each count and supplying each count to said microprocessor when said microprocessor is ready to receive the count information.

9. Apparatus for measuring alternating current on a power line having a known fundamental frequency, including means for developing a low power signal directly related to the line current on said power line, first means for sensing when said low power signal exceeds a first predetermined positive threshold value, second means for sensing when said low power signal falls below a second predetermined negative threshold value, means for generating a first measurement signal having a duration related to the time when said low power signal exceeds said positive threshold value, means for generating a second measurement signal having a duration related to the time when said low power signal falls below said negative threshold value, processing circuitry, and means for transmitting said measurement signals to said processing circuitry, said processing circuitry processing the duration of said measurement signals to determine parameters of said low power signal thereby to determine the current flowing in said power line.

10. The apparatus of claim 9, wherein said means for developing said low power signal includes an isolation transformer, the primary of which is said power line and which has a multi-turn secondary.

11. The apparatus of claim 9, wherein one of said predetermined threshold values is greater than the other predetermined threshold value thereby to extend the dynamic operating range of said current measuring device.

12. The apparatus of claim 11, wherein said first predetermined threshold value is determined by the breakdown voltage of a Zener diode and is a relatively low breakdown voltage and said second predetermined threshold value is established by the breakdown voltage of a second Zener diode which has a higher breakdown voltage than the first Zener diode.

13. The apparatus of claim 9, wherein said first and second sensing means comprise a full wave diode bridge with four legs, one of which has a first Zener diode for establishing said positive threshold value, another of which has a second Zener diode for establishing said negative threshold value.

14. The apparatus of claim 13, wherein said first and second signal generating means are the same means and are defined by a light emitting diode connected across said diode bridge.

15. The apparatus of claim 14, wherein said transmitting means includes a fiber optic element and said processing circuitry includes a photosensitive element.

16. The apparatus of claim 9, including means for converting said measurement signals from electrical signals to optical signals, said transmitting means including an optical fiber device and said processing circuitry, including a photosensitive device for converting the optical signals back to electrical signals.

17. The apparatus of claim 9, wherein said processing circuitry includes a microprocessor.

18. The apparatus of claim 17, wherein said processing circuitry includes means for sensing the rising edge of each of said measurement signals and the falling edge of each of said measurement signals and means for supplying such information to said microprocessor for processing said measurement signals.

19. The apparatus of claim 15, wherein said processing circuitry includes an exclusive OR gate, means for supplying an output signal from said photosensitive device directly to said OR gate, means for delaying and then supplying said photosensitive output signal to said OR gate, the output of said OR gate being coupled to an INTERRUPT REQUEST input of said microprocessor, and a latch circuit having a data input also coupled to said photosensitive output said latch circuit also having a clock input coupled to said output of said OR gate, and an output coupled to an input port of said microprocessor.

20. The apparatus of claim 17, wherein said processing circuitry includes, means for generating a clock signal, a counter, means for summing each measurement signal with said clock signal, said clock signal having a predetermined number of pulses per second and supplying said clock signal for the duration of each measurement signal to said counter, said counter having means for counting the pulses received for the duration of each of said measurement signals, and having means for storing each count, said counter being coupled to said microprocessor, and means for indicating to said microprocessor that a count directly related to a measurement signal duration is ready for inputting into said microprocessor and supplying such count to said microprocessor when the microprocessor is ready to receive the count information.

21. The apparatus of claim 20, wherein said means for generating a clock signal comprises an oscillator, said summing means comprise an AND gate having one input coupled to said oscillator and another input coupled to said output of said photosensitive device, and said means for indicating to said microprocessor when a count is ready to be inputted comprising an inverting amplifier having an input coupled to said output of said photosensitive device and an output coupled to an INTERRUPT REQUEST input of said microprocessor, the output of said AND gate being coupled to a CLOCK input of said counter, the output of said counter being coupled to one input port of said microprocessor and an output port of said microprocessor being coupled to a RESET input of said counter.

* * * * *